(12) United States Patent
Badrieh et al.

(10) Patent No.: US 11,984,187 B2
(45) Date of Patent: *May 14, 2024

(54) DYNAMIC ALLOCATION OF A CAPACITIVE COMPONENT IN A MEMORY DEVICE

(71) Applicant: Micron Technology, Inc., Boise, ID (US)

(72) Inventors: Fuad Badrieh, Boise, ID (US); Thomas H. Kinsley, Boise, ID (US); Baekkyu Choi, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/569,303

(22) Filed: Jan. 5, 2022

(65) Prior Publication Data

US 2022/0130431 A1  Apr. 28, 2022

Related U.S. Application Data

(63) Continuation of application No. 17/025,628, filed on Sep. 18, 2020, now Pat. No. 11,238,903, which is a
(Continued)

(51) Int. Cl.
*G11C 5/06* (2006.01)
*G06F 13/16* (2006.01)
(Continued)

(52) U.S. Cl.
CPC .......... *G11C 5/063* (2013.01); *G06F 13/1668* (2013.01); *G11C 11/221* (2013.01);
(Continued)

(58) Field of Classification Search
CPC ... G11C 5/063; G11C 11/221; G11C 11/4091; G11C 11/2273; G11C 11/5657;
(Continued)

(56) References Cited

U.S. PATENT DOCUMENTS 3,706,975 A   12/1972  Paluck
4,577,064 A    3/1986  Huft et al.
(Continued)

FOREIGN PATENT DOCUMENTS

CN       1710665 A    12/2005
CN     102298957 A    12/2011
(Continued)

OTHER PUBLICATIONS

Dencho et al., Charge Storage and Reliability Characteristics of Nonvolatile Memory Capacitors with HfO2/Al2O, 2022, MDPI AG, all pages. (Year: 2022).*

(Continued)

*Primary Examiner* — Michael T Tran
(74) *Attorney, Agent, or Firm* — Holland & Hart LLP

(57) ABSTRACT

Methods and devices for dynamic allocation of a capacitive component in a memory device are described. A memory device may include one or more voltage rails for distributing supply voltages to a memory die. A memory device may include a capacitive component that may be dynamically coupled to a voltage rail based on an identification of an operating condition on the memory die, such as a voltage droop on the voltage rail. The capacitive component may be dynamically coupled with the voltage rail to maintain the supply voltage on the voltage rail during periods of high demand. The capacitive component may be dynamically switched between voltage rails during operation of the memory device based on operating conditions associated with the voltage rails.

17 Claims, 8 Drawing Sheets

Related U.S. Application Data continuation of application No. 16/268,092, filed on Feb. 5, 2019, now Pat. No. 10,796,729.

(51) Int. Cl.
- *G11C 11/22* (2006.01)
- *G11C 11/4091* (2006.01)
- *G11C 11/408* (2006.01)
- *G11C 11/56* (2006.01)

(52) U.S. Cl.
CPC ...... *G11C 11/2273* (2013.01); *G11C 11/4091* (2013.01); *G11C 11/2255* (2013.01); *G11C 11/2257* (2013.01); *G11C 11/4087* (2013.01); *G11C 11/565* (2013.01); *G11C 11/5657* (2013.01)

(58) Field of Classification Search
CPC .......... G11C 11/2255; G11C 11/2257; G11C 11/4087; G11C 11/565; G11C 11/406; G11C 11/4074; G11C 5/147; G11C 5/10; G06F 13/1668
USPC .................................. 365/149, 226
See application file for complete search history.

(56) References Cited

U.S. PATENT DOCUMENTS

| | | | |
|---|---|---|---|
| 5,299,167 A * | 3/1994 | Yano | G11C 11/415 365/204 |
| 5,706,225 A | 1/1998 | Buchenrieder et al. | |
| 5,879,972 A | 3/1999 | Umeki | |
| 6,337,824 B1 * | 1/2002 | Kono | G11C 11/4091 365/207 |
| 6,385,115 B1 * | 5/2002 | Nakai | G11C 11/4091 365/207 |
| 6,779,076 B1 | 8/2004 | Shirley | |
| 6,981,089 B2 | 12/2005 | Dodd et al. | |
| 7,042,789 B2 * | 5/2006 | Bangert | G11C 11/1655 365/230.02 |
| 7,948,792 B1 | 5/2011 | Lee et al. | |
| 8,310,098 B2 * | 11/2012 | Kumar | H02M 3/06 307/66 |
| 8,866,719 B2 * | 10/2014 | Nishi | G11C 11/406 345/98 |
| 8,934,280 B1 * | 1/2015 | Kuo | G11C 11/1693 365/163 |
| 9,697,882 B1 * | 7/2017 | Evans, Jr. | G11C 11/221 |
| 9,761,312 B1 | 9/2017 | Kajigaya | |
| 9,805,772 B1 * | 10/2017 | Penney | H03K 19/20 |
| 9,921,763 B1 | 3/2018 | Zitlaw | |
| 10,032,496 B1 | 7/2018 | Bedeschi et al. | |
| 10,224,087 B1 * | 3/2019 | Jung | G11C 27/02 |
| 10,224,949 B1 * | 3/2019 | Li | H03M 1/123 |
| 10,388,355 B1 | 8/2019 | Ware et al. | |
| 10,878,899 B1 | 12/2020 | Islam et al. | |
| 10,886,911 B2 * | 1/2021 | Willard | H01L 27/1203 |
| 2002/0163380 A1 * | 11/2002 | Hughes | G06J 1/00 365/45 |
| 2003/0022427 A1 | 1/2003 | Ferrant et al. | |
| 2003/0185040 A1 * | 10/2003 | Rickes | H01L 27/0688 257/E27.026 |
| 2003/0223272 A1 | 12/2003 | Mihnea et al. | |
| 2005/0152203 A1 * | 7/2005 | Choi | G11C 5/14 365/230.03 |
| 2006/0095592 A1 | 5/2006 | Borkenhagen | |
| 2006/0176752 A1 * | 8/2006 | Lindstedt | G11C 29/1201 365/226 |
| 2007/0247885 A1 | 10/2007 | Watanabe et al. | |
| 2008/0175088 A1 | 7/2008 | Choi et al. | |
| 2008/0205147 A1 | 8/2008 | Santin et al. | |
| 2009/0027972 A1 | 1/2009 | Bode | |
| 2009/0103365 A1 | 4/2009 | Roohparvar et al. | |
| 2009/0116328 A1 * | 5/2009 | Ito | G11C 7/20 365/226 |
| 2009/0206680 A1 | 8/2009 | Chun et al. | |
| 2009/0268520 A1 | 10/2009 | Roohparvar | |
| 2009/0316470 A1 * | 12/2009 | Takizawa | G11C 11/4076 365/226 |
| 2010/0046306 A1 * | 2/2010 | Takahashi | G11C 7/12 365/207 |
| 2010/0244788 A1 * | 9/2010 | Chen | H02M 3/1584 323/234 |
| 2011/0080796 A1 | 4/2011 | Bruennert et al. | |
| 2012/0008375 A1 | 1/2012 | Tay | |
| 2012/0127781 A1 | 5/2012 | Saito | |
| 2014/0064010 A1 | 3/2014 | Barkley et al. | |
| 2014/0078815 A1 | 3/2014 | Hollis | |
| 2014/0233330 A1 | 8/2014 | Ko et al. | |
| 2014/0269011 A1 | 9/2014 | Dally et al. | |
| 2014/0293692 A1 * | 10/2014 | Chen | G11C 16/06 365/185.11 |
| 2014/0321202 A1 | 10/2014 | Yang et al. | |
| 2015/0162058 A1 * | 6/2015 | Joshi | G11C 15/04 365/189.11 |
| 2015/0199133 A1 | 7/2015 | Abdulla et al. | |
| 2015/0229303 A1 | 8/2015 | Li | |
| 2015/0234746 A1 | 8/2015 | Jo | |
| 2015/0255138 A1 | 9/2015 | Rodriguez-latorre et al. | |
| 2015/0263069 A1 | 9/2015 | Jo | |
| 2016/0027809 A1 * | 1/2016 | Kobayashi | H01L 29/7869 257/43 |
| 2016/0372180 A1 | 12/2016 | Amara et al. | |
| 2017/0003779 A1 | 1/2017 | Reynolds et al. | |
| 2017/0032831 A1 * | 2/2017 | Yu | G11C 7/08 |
| 2017/0358327 A1 | 12/2017 | Oh et al. | |
| 2018/0034374 A1 | 2/2018 | Breen et al. | |
| 2018/0061468 A1 | 3/2018 | Derner et al. | |
| 2018/0137909 A1 | 5/2018 | Shaeffer et al. | |
| 2018/0375497 A1 * | 12/2018 | Hashimoto | H01L 28/20 |
| 2019/0051352 A1 | 2/2019 | Mccollum | |
| 2019/0115092 A1 | 4/2019 | Tsai et al. | |
| 2019/0164591 A1 | 5/2019 | Takahashi et al. | |
| 2019/0189190 A1 | 6/2019 | Di Vincenzo et al. | |
| 2019/0196742 A1 * | 6/2019 | Yudanov | G06F 1/3225 |
| 2019/0198103 A1 | 6/2019 | Yang et al. | |
| 2019/0198106 A1 | 6/2019 | Parkinson et al. | |
| 2019/0252612 A1 | 8/2019 | Tortorelli et al. | |
| 2019/0259462 A1 | 8/2019 | Lu et al. | |
| 2019/0267096 A1 | 8/2019 | Yang et al. | |
| 2019/0280688 A1 | 9/2019 | Ruffieux et al. | |
| 2019/0295671 A1 | 9/2019 | Bang et al. | |
| 2019/0325934 A1 | 10/2019 | Matsubara | |
| 2019/0355397 A1 * | 11/2019 | Ishizu | G11C 5/148 |
| 2019/0385680 A1 | 12/2019 | Dunga et al. | |
| 2020/0021260 A1 * | 1/2020 | Lee | H03G 5/28 |
| 2020/0081848 A1 | 3/2020 | Bae et al. | |
| 2020/0112320 A1 * | 4/2020 | Ikeda | H01L 21/8234 |
| 2020/0145599 A1 * | 5/2020 | Matsuzaki | H01L 27/146 |
| 2020/0211639 A1 * | 7/2020 | Raad | G11C 11/5657 |
| 2020/0243542 A1 | 7/2020 | Ota | H01L 23/5228 |
| 2020/0381038 A1 * | 12/2020 | Choi | G11C 11/4085 |
| 2021/0050048 A1 * | 2/2021 | Ito | G11C 11/4074 |
| 2021/0074336 A1 | 3/2021 | Kumagai | G11C 5/141 |
| 2021/0217801 A1 * | 7/2021 | Sugawa | H01L 27/14643 |
| 2021/0225423 A1 * | 7/2021 | Moon | H01L 25/18 |
| 2021/0319749 A1 * | 10/2021 | Ueno | G09F 9/30 |
| 2023/0030630 A1 * | 2/2023 | Goh | G11C 29/021 |
| 2023/0041306 A1 * | 2/2023 | Lee | G06N 3/063 |
| 2023/0046588 A1 * | 2/2023 | Zhao | H03F 1/3247 |
| 2023/0078079 A1 * | 3/2023 | Atallah | G06N 3/065 706/22 |
| 2023/0078279 A1 * | 3/2023 | Lee | G11C 7/1006 |
| 2023/0100397 A1 * | 3/2023 | Song | H01L 25/0655 365/226 |
| 2023/0102395 A1 * | 3/2023 | Mun | G11C 16/10 365/185.22 |

(56) References Cited

U.S. PATENT DOCUMENTS

FOREIGN PATENT DOCUMENTS

| CN | 112802520 A | * | 5/2021 | ........... G11C 11/413 |
|----|-------------|---|--------|-------------------------|
| CN | 108141213 B | * | 7/2021 | ........... H03K 19/003 |
| DE | 102022105693 B3 | * | 3/2023 | ........... G11C 11/413 |
| JP | 2014203467 A | * | 10/2014 | ......... G11C 11/5628 |
| WO | WO-2017090176 A1 | * | 6/2017 | ........... G06F 11/008 |
| WO | WO-2018158650 A1 | * | 9/2018 | ........... G11C 11/405 |

OTHER PUBLICATIONS

China National Intellectual Property Administration, "First Office Action," issued in connection with Chinese Patent Application No. 202010080788.7, dated Mar. 11, 2021 (14 pages with translation).
ISA/KR, International Search Report and Written Opinion of the International Searching Authority, Int'l. Appl. No. PCT/US2020/016946, dated Jun. 5, 2020, Korean Intellectual Property Office, Seo-gu, Daejeon, Republic of Korea, 18 pgs.

* cited by examiner

US 11,984,187 B2

DYNAMIC ALLOCATION OF A CAPACITIVE COMPONENT IN A MEMORY DEVICE

CROSS REFERENCE

The present Application for Patent is a continuation of U.S. patent application Ser. No. 17/025,628 by Badrieh et al., entitled "DYNAMIC ALLOCATION OF A CAPACITIVE COMPONENT IN A MEMORY DEVICE," filed Sep. 18, 2020, now U.S. Pat. No. 11,238,903, which is a continuation of U.S. patent application Ser. No. 16/268,092 by Badrieh et al., entitled "DYNAMIC ALLOCATION OF A CAPACITIVE COMPONENT IN A MEMORY DEVICE," filed Feb. 5, 2019, now U.S. Pat. No. 10,796,729, each of which assigned to the assignee hereof and each of which is expressly incorporated by reference in its entirety herein.

BACKGROUND

The following relates generally to a system that includes at least one memory device and more specifically to dynamic allocation of a capacitive component in a memory device.

Memory devices are widely used to store information in various electronic devices such as computers, wireless communication devices, cameras, digital displays, and the like. Information is stored by programing different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

DETAILED DESCRIPTION

Figure 1:
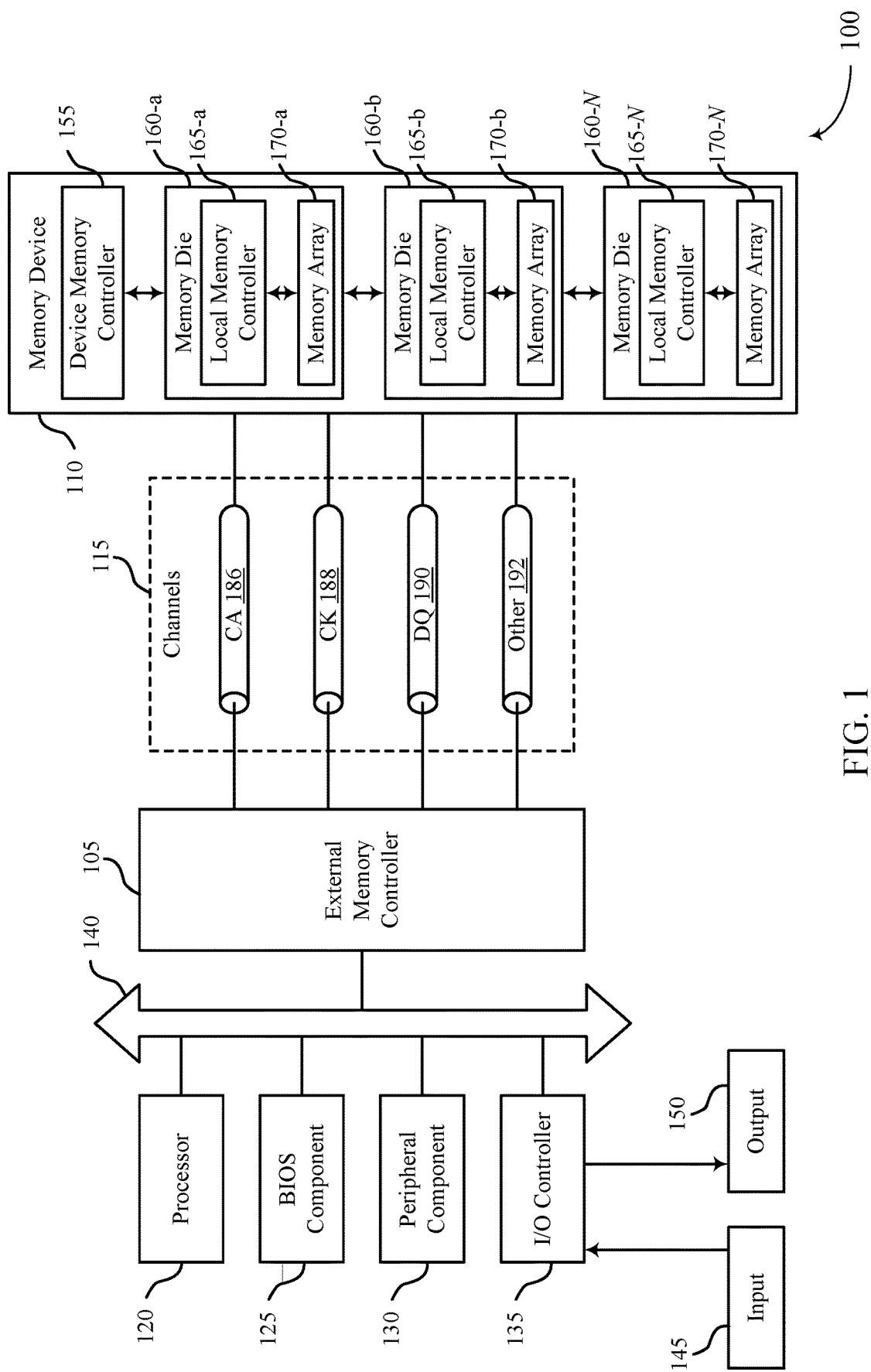
FIG. 1 illustrates an example of a system that supports dynamic allocation of a capacitive component in a memory device in accordance with examples as disclosed herein.

A memory die may include a power distribution network (PDN) to distribute power to various components of the memory die. The PDN may receive electrical power from one or more power supplies or voltage sources and may distribute the power or voltages across the die using one or more voltage "rails" (e.g., conductive paths). For example, a memory die may include a VDD voltage rail for distributing a VDD supply voltage to the memory die, a Vss voltage rail for distributing a Vss supply voltage to the memory die, etc. The voltage rails may each be coupled with or include a network of resistors separated by conductive lines, which may be referred to as a resistive grid.

In some cases, a voltage along a voltage rail may droop (e.g., drop, decrease) or spike (e.g., rise, increase) relative to the corresponding supply voltage. For example, the voltage on the voltage rail may droop in response to the voltage or current demand of various components on the memory die, such as memory cells, switches, amplifiers, etc. In some cases, if a voltage rail experiences a relatively large droop, the rail may be unable to provide sufficient voltage or current to components on the memory die to enable proper operation.

A resistive grid in a PDN may include various capacitive elements (e.g., capacitors) coupled with the corresponding voltage rail to help the voltage rail maintain the supply voltage over a range of operating conditions. Such capacitive elements may provide additional charge (e.g., voltage) to a voltage rail over short durations of high demand, and thus their inclusion may be conceptually similar to having small auxiliary power supplies distributed throughout the PDN.

In some cases, the size or quantity of capacitors coupled with a voltage rail may affect the range of voltage variations on the rail that can be compensated to maintain the supply voltage along the rail. That is, a larger amount of capacitance may be able to provide (or absorb) more charge to/from a voltage rail, and therefore may be able to compensate for a larger range of voltage variations on the rail. Using larger or more numerous capacitors, however, may consume more area and may cost more than using smaller or fewer capacitors. Thus, in some cases, the size and/or quantity of capacitors included in a PDN may be a design consideration for the PDN.

In some cases, a circuit may be designed to use a relatively large amount of capacitance to compensate for worst-case voltage variations on a voltage rail. Such large capacitance may not be needed under most operating conditions, and therefore may represent wasted resources during periods when the additional capacitance is not needed.

A memory die may include a capacitive component (such as one or more capacitors) that may be dynamically coupled with a voltage rail to compensate for voltage variations on the rail when certain operating conditions are identified, such as a relatively large voltage droop or spike. The operating conditions may be determined by a control component based on, for example, sensing that a voltage on the memory die satisfies a threshold condition, or predicting that a voltage on the memory die will satisfy a threshold condition based on a received sequence of commands.

In some cases, the capacitive component may be switched between a first voltage rail and a second voltage rail based on operating conditions associated with the first rail and/or the second rail. That is, in some cases, the capacitive component may be dynamically allocated to whichever voltage rail is experiencing excessive demand.

As previously discussed, each voltage rail may be associated with a resistive grid that includes discrete capacitors (e.g., separate from the dynamically allocated capacitive component). In some cases, instead of or in addition to coupling a dynamically allocated capacitive component with the voltage rails, two voltage rails associated with the same supply voltage may be dynamically coupled with each other to provide additional capacitance to the voltage rails during periods of high demand.

Features of the disclosure are initially described in the context of a memory system and memory die as described with reference to FIGS. 1 and 2. Features of the disclosure are described in the context of a memory die with multiple voltage rails as described with reference to FIGS. 3-5. These and other features of the disclosure are further illustrated by and described with reference to an apparatus diagram and flowcharts that relate to dynamic allocation of a capacitive component in a memory device as described with reference to FIGS. 6-8.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

In some cases, a memory device 110 may include a power distribution network (PDN) for distributing power received from a power supply (e.g., a voltage supply, voltage regulator) to memory array 170. The PDN may include one or more voltage rails, each of which may be coupled with a voltage supply. In some cases, the PDN may include a capacitive component that may be dynamically switched between voltage rails to provide additional capacitance (e.g., additional charge) to the rail during periods of high demand and thereby maintain the supply voltage on the voltage rail.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N(e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

A controller (e.g., external memory controller 105, device memory controller 155, and/or local memory controller 165, or combination thereof) may identify an operating condition associated with a voltage rail in the PDN (e.g., a measured or predicted voltage droop or spike), and may respond by coupling a capacitive component with the voltage rail to maintain the voltage on the voltage rail. In some cases, the controller may predict a voltage droop or spike on a voltage rail based on receiving a sequence of one or more commands that specify memory operations that may, when executed sequentially or in parallel, cause the voltage on a voltage rail to droop or spike.

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel.

In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth. Signals communicated over the channels may use double data rate (DDR) signaling. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK t signal and a CK c signal) and the signal paths of the CK channels 188 may be configured accordingly. In some cases, the clock signal may be single ended. A CK channel 188 may include any quantity of signal paths. In some cases, the clock signal CK (e.g., a CK t signal and a CK c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., NRZ, PAM4).

In some cases, the channels 115 may include one or more other channels 192 that may be dedicated to other purposes. These other channels 192 may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

Figure 2:
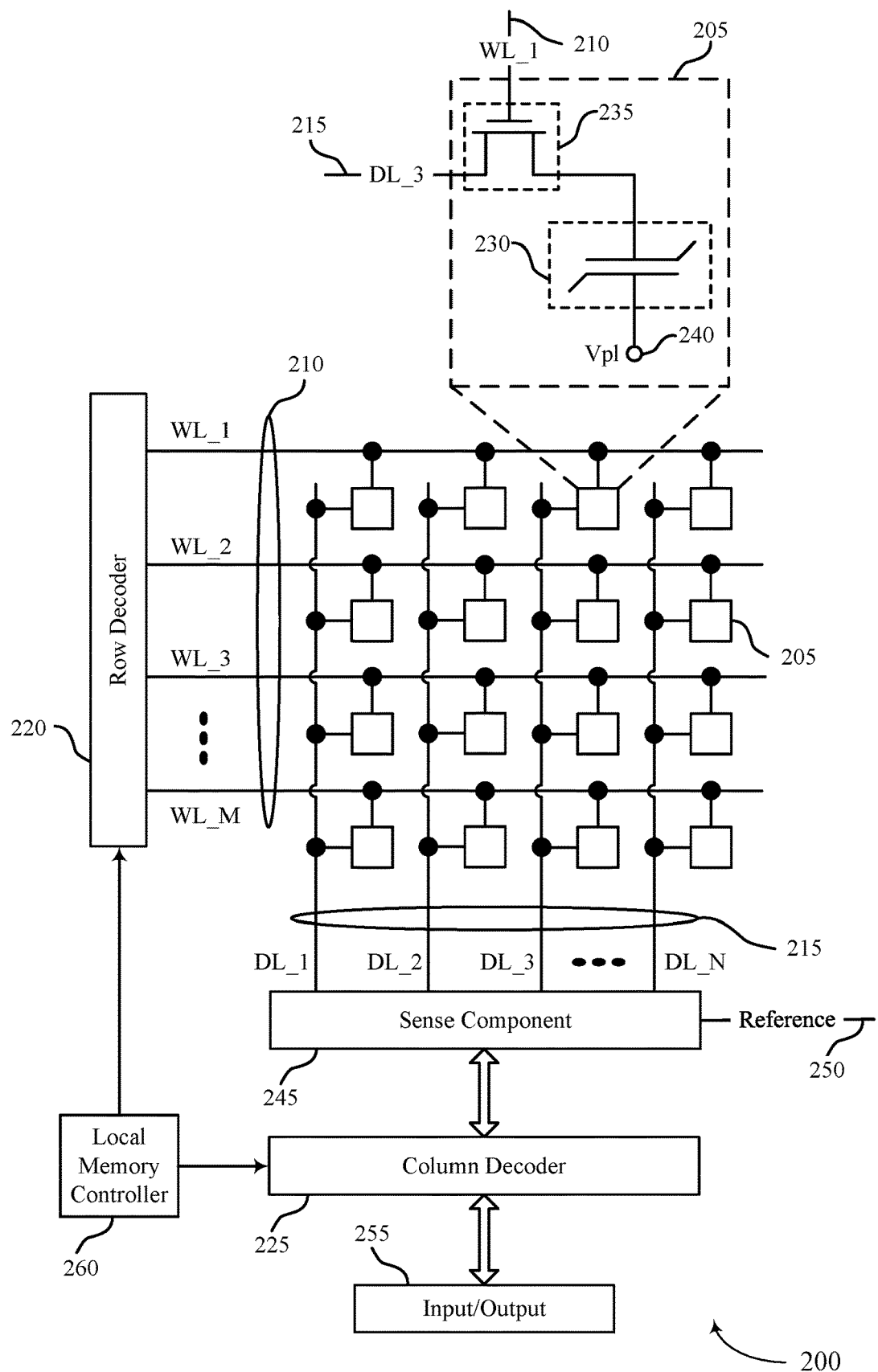
FIG. 2 illustrates an example of a memory die that supports dynamic allocation of a capacitive component in a memory device in accordance with examples as disclosed herein.

FIG. 2 illustrates an example of a memory die 200 in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. For example, memory cells in DRAM architectures may each include a capacitor that includes a dielectric material to store a charge representative of the programmable state. In other types of memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL M, and multiple digit lines 215, labeled DL_1 through DL N, where M and N depend on the size of the memory array. Thus, by activating a word line 210 and a digit line 215, e.g., WL_1 and DL 3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vp1, or may be ground, such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of memory cell 205 may be output through column decoder 225 as output 255. In some cases, the sense component 245 may be part of another component (e.g., a column decoder 225, row decoder 220). In some cases, the sense component 245 may be in electronic communication with the row decoder 220 or the column decoder 225.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

Memory die 200 may include or be coupled with one or more voltage rails that may supply power to some or all of memory die 200. In some cases, local memory controller 260 or another control component may identify an operating condition associated with a voltage rail (e.g., a measured or predicted voltage droop or spike), and may respond by coupling a capacitive component with the voltage rail to maintain the voltage on the voltage rail. In some cases, local memory controller 260 (or other control component) may predict a voltage droop or spike on a voltage rail based on receiving a sequence of one or more commands that specify memory operations that may, when executed sequentially or in parallel, cause the voltage on a voltage rail to droop or spike.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

Figure 3:
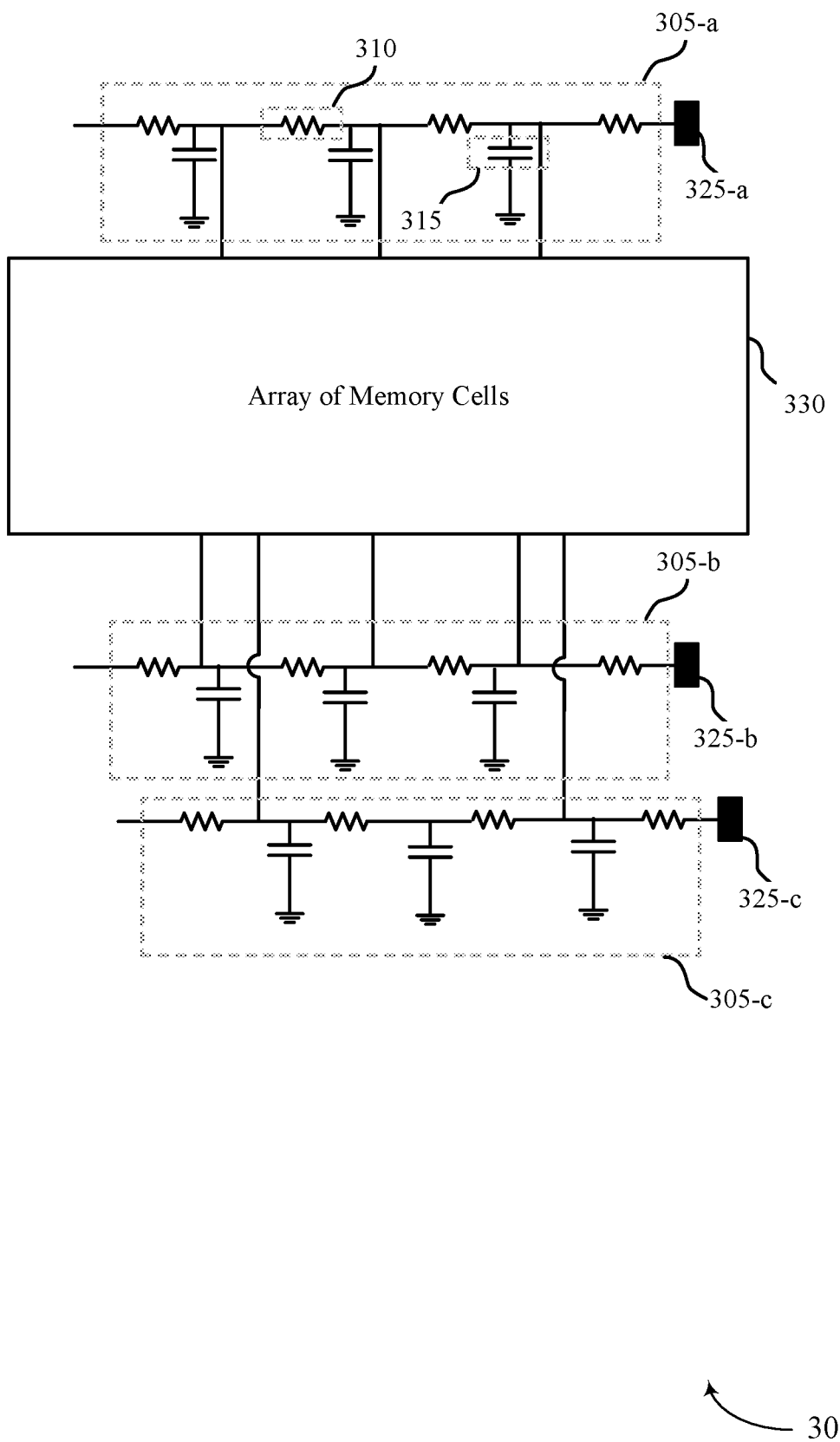
FIG. 3 illustrates an example of a circuit that supports dynamic allocation of a capacitive component in a memory device in accordance with examples as disclosed herein.

FIG. 3 illustrates an example of a circuit 300 that supports dynamic allocation of a capacitive component in a memory device in accordance with examples as disclosed herein Circuit 300 may be included in a memory device, such as memory device 110 described with reference to FIG. 1. Circuit 300 includes an array of memory cells 330 that may be included in a memory array such as memory array 170, for example.

Circuit 300 may include three voltage rails 305, each of which may include resistive elements 310 and (optionally) capacitors 315 connected in a grid. Each voltage rail 305 may be coupled with a corresponding supply voltage source via, for example, pad 325 (which may provide electrical access to the voltage rail from off the die or off the memory device) or via a direct electrical connection, using an on-die voltage source. A supply voltage source may be a voltage regulator or power supply, for example, and may be configured to supply (e.g., apply) a substantially constant supply voltage to voltage rail 305. Voltage rails 305 may be configured to distribute (e.g., transfer) the supply voltage applied by a voltage source to (e.g., across) the array of memory cells 330 and/or to other portions of a memory device using the resistive grid, for example. In some cases, a pad 325 of circuit 300 may be coupled with a VDD voltage source, a Vss voltage source, a $V_{CC}$ voltage source, a $V_{PP}$ voltage source, or another supply voltage source. Such supply voltage sources may provide power to the array of memory cells 330 and/or to other components in a memory device during operation of the memory device.

In some cases, a supply voltage may be applied to a voltage rail 305 via a pad 325. Each pad 325 may receive a different supply voltage for the corresponding voltage rail 305. For example, pad 325-a may receive a Vss voltage for voltage rail 305-a, pad 325-b may receive a VDD voltage for voltage rail 305-b, and/or pad 325-c may receive a $V_{CC}$ voltage for voltage rail 305-c. In some cases, two voltage rails 305 may be coupled with the same voltage source, or two voltage sources may supply the same voltage to two corresponding voltage rails 305. That is, the voltage rails 305 may be used to distribute the same or different voltages to the array of memory cells 330 and/or to other portions of a memory die.

In some cases, a voltage of voltage rail 305 may vary along voltage rail 305; that is, the voltage at one location on voltage rail 305 may be different than the voltage at another location on voltage rail 305. For example, the voltage of voltage rail 305 at a location far away from voltage source may be lower than the voltage of voltage rail 305 nearer to voltage source due to current or voltage demand from various components coupled with voltage rail 305 (such as memory cells in the array of memory cells 330), or due to parasitic capacitance along voltage rail 305. Thus, voltage rail 305 may be considered as having various current sources connected to voltage rail 305, with each current source representing a component (or multiple components) that demands current from voltage rail 305.

A voltage rail 305 may include capacitors 315 along voltage rail 305 to help compensate for such voltage variations by supplying additional voltage or charge to the voltage rail 305. Such capacitors 315 may be hardwired to voltage rail 305 and serve as distributed charge suppliers that may supply additional charge to meet current demand along voltage rail 305, thereby avoiding propagating such demand back to the voltage source, which may cause a larger voltage droop on the rail.

As described with reference to FIG. 4, in some cases a memory device may also include a capacitive component that may be dynamically coupled with a voltage rail 305 to maintain a voltage (e.g., a supply voltage) on the voltage rail 305 during periods of high demand.

Figure 4:
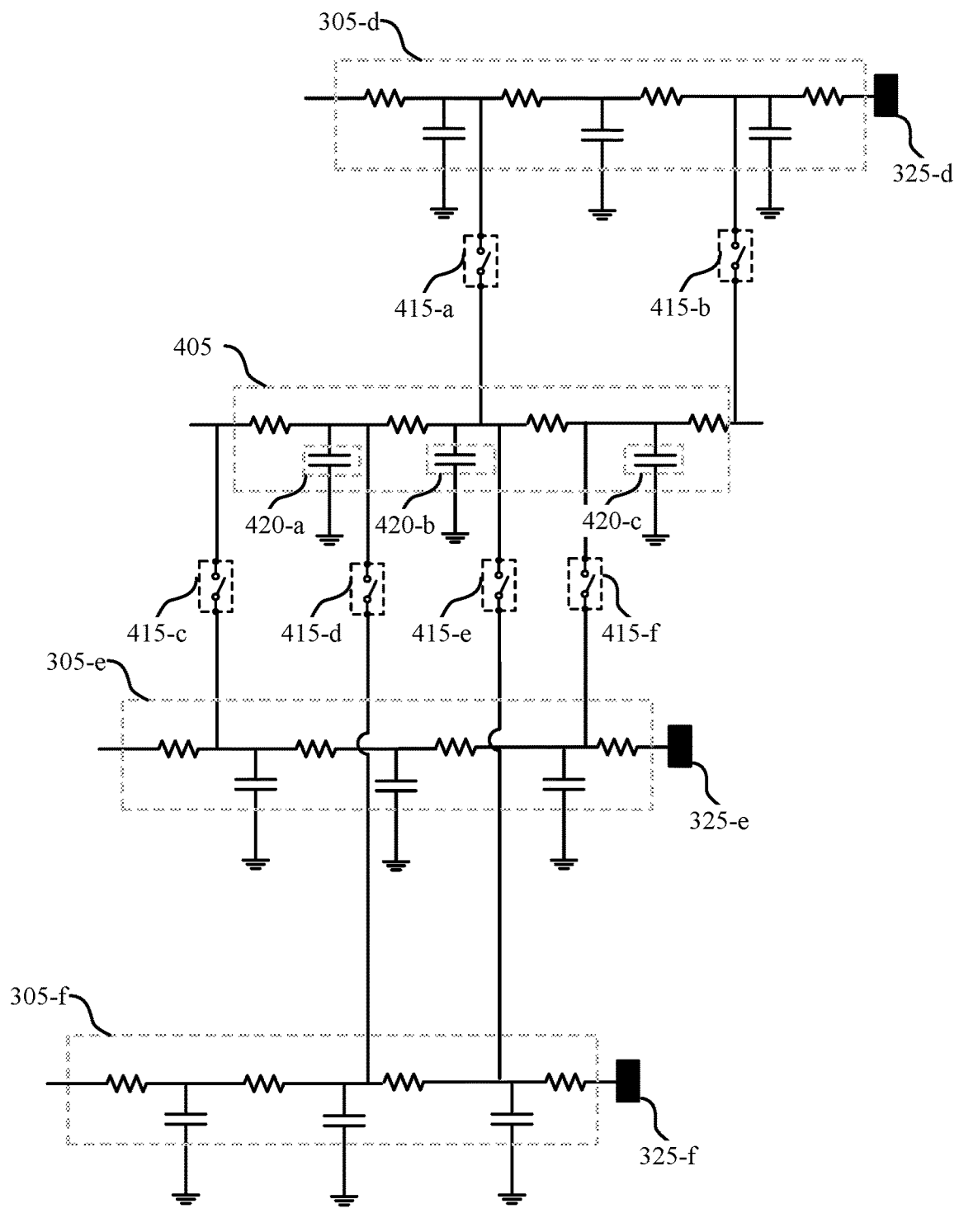
FIG. 4 illustrates an example of a circuit that supports dynamic allocation of a capacitive component in a memory device in accordance with examples as disclosed herein.

FIG. 4 illustrates an example of a circuit 400 that supports dynamic allocation of a capacitive component in a memory device in accordance with examples as disclosed herein. Circuit 400 includes voltage rails 305, pads 325, and voltage sources as described with reference to FIG. 3. Such voltage rails 305 may be used to transfer power or voltage from voltage sources to an array of memory cells (such as array of memory cells 330) and/or to other components on a memory die.

Circuit 400 may include capacitive component 405. Capacitive component 405 may be dynamically coupled with voltage rail 305-d, voltage rail 305-e, and/or voltage rail 305-f by activating various switching components 415. That is, capacitive component 405 may be selectively couplable (able to be coupled) with voltage rail 305-d, voltage rail 305-e, and/or voltage rail 305-f Capacitive component 405 may provide additional capacitance to a voltage rail 305 while it is coupled with the voltage rail 305. Voltage rail 305 may distribute (e.g., transfer) a voltage to an array of memory cells while it is isolated from capacitive component 405 or while it is coupled with capacitive component 405. The voltage transferred to the array of memory cells may be based on the supply voltage applied to the voltage rail 305 by the corresponding voltage source. In the ideal case, the voltage transferred to the array of memory cells 330 may be the same as the supply voltage, but in practice the voltage transferred to the array of memory cells 330 may differ from the supply voltage due to voltage droop along voltage rail 305, for example.

Capacitive component 405 may include a single discrete capacitor. In other cases, capacitive component 405 may include multiple discrete capacitors 420 coupled with each other via a resistive network, as depicted in FIG. 4. In some cases, a first portion of capacitive component 405 (e.g., a first set of capacitors in capacitive component 405) may be coupled with one voltage rail 305, and another portion of capacitive component 405 (e.g., a second set of capacitors in capacitive component 405) may be coupled with a different voltage rail 305. That is, some or all of the discrete capacitors 420 in capacitive component 405 may be dynamically allocated to or switched between different voltage rails 305 based on operating conditions associated with the different voltage rails 305.

In some cases, a control component (such as local memory controller 165, device memory controller 155, external memory controller 105, and/or other control circuitry that may be included on a memory die with the array of memory cells 330, or a combination thereof) may identify an operating condition associated with a voltage rail 305, such as a measured or predicted spike or droop in the voltage on the voltage rail 305 or at another location that is coupled with (e.g., receives a voltage from) voltage rail 305. Based on the identified operating condition, the control component may cause some or all of the capacitive component 405 to be coupled with the voltage rail 305 by activating one or more switching components 415. Coupling the capacitive component 405 with the voltage rail 305 may help to maintain the target voltage (e.g., the supply voltage) on the voltage rail 305 during some or all of an access operation of the array of memory cells 330, for example.

In some cases, the operating condition may be identified by sensing operating voltages (e.g., voltages that occur during operation of the memory device) at one or more locations along the voltage rail 305 and/or at one or more locations on a memory device that are coupled with the voltage rail 305, and comparing the sensed voltage(s) to a threshold. The voltage(s) may be sensed using one or more sensors, for example. The threshold may be a minimum voltage or a maximum voltage, for example. If one or more of the sensed voltages satisfies the threshold (e.g., a sensed voltage is below a minimum voltage or above a maximum voltage), some or all of capacitive component 405 may be coupled with the voltage rail 305.

In some cases, instead of comparing each of multiple sensed voltages with a threshold, an average, mean, minimum, maximum, or other function of multiple sensed voltages may be compared with a threshold to identify the operating condition.

The operating condition may be identified by predicting that a voltage at one or more locations along voltage rail 305 and/or at one or more locations that are coupled with voltage rail 305 will satisfy a threshold (e.g., predicting that a voltage will exceed a maximum voltage or droop below a minimum voltage). A control component may receive one or more commands that specify a sequence of one or more memory operations to be performed on the array of memory cells (such as read, write, refresh operations) and predict that a voltage associated with a voltage rail will satisfy the threshold when performing the sequence of one or more memory operations. For example, in a DRAM memory device, a refresh operation may use more power from a VDD voltage rail and less power from a $V_{DDQ}$ voltage rail, and thus a control component may predict, based on receiving a command specifying the refresh operation, that the VDD rail may satisfy a threshold (e.g., that the VDD rail may need additional capacitance/charge during the refresh operation). In such examples, the control component may couple the capacitive component 405 with the VDD voltage rail during at least a portion of the refresh operation to maintain the voltage on the VDD voltage rail.

A control component may predict that a voltage will satisfy the threshold based on previous electrical simulations of the sequence of operations on the memory device, based on or based on predetermined sequences of operations, or using other predictive methods. The commands received by the control component may be pipelined, enabling the control component to predict subsequent operating conditions on the memory die based on the received commands.

A control component may switch some or all of capacitive component 405 (e.g., some or all of the discrete capacitors in capacitive component 405) from a first voltage rail 305 to a second voltage rail 305 based on an operating condition associated with the second voltage rail 305. In some cases, the control component may isolate a portion of the capacitive component 405 from the first voltage rail before coupling that portion of the capacitive component 405 with the second voltage rail, by deactivating one or more switching components 415 associated with coupling the portion of the capacitive component 405 with the first voltage rail 305.

For example, if capacitive component 405 is coupled with voltage rail 305-d (e.g., switching components 415-a and 415-b are activated), the control component may deactivate a first set of switching components (e.g., switching components 415-a and/or 415-b) to isolate the capacitive component 405 from voltage rail 305-d before coupling the capacitive component 405 with voltage rail 305-e by activating a second set of switching components (e.g., switching components 415-c, 415-d, 415-e, and/or 415-f).

Capacitive component 405 may be pre-charged to a first pre-charge voltage before capacitive component 405 is coupled with a voltage rail 305 so that capacitive component 405 is capable of providing additional charge or voltage to the voltage rail 305 when capacitive component 405 is coupled with the voltage rail 305. For example, capacitive component 405 may be pre-charged to a supply voltage associated with the voltage rail 305, or to a voltage that is higher than the supply voltage associated with the voltage rail 305, or to another voltage. In some cases, if capacitive component 405 is switched from a first voltage rail (e.g., voltage rail 305-d) to a second voltage rail (e.g., voltage rail 305-e), capacitive component 405 may be pre-charged (e.g., recharged) to a second pre-charge voltage before it is coupled with the second voltage rail. The second pre-charge voltage may be the supply voltage associated with the second voltage rail, for example, or another voltage. In some cases, capacitive component 405 may be pre-charged (recharged) to the second pre-charge voltage after it is isolated from the first voltage rail and before it is coupled with the second voltage rail.

Figure 5:
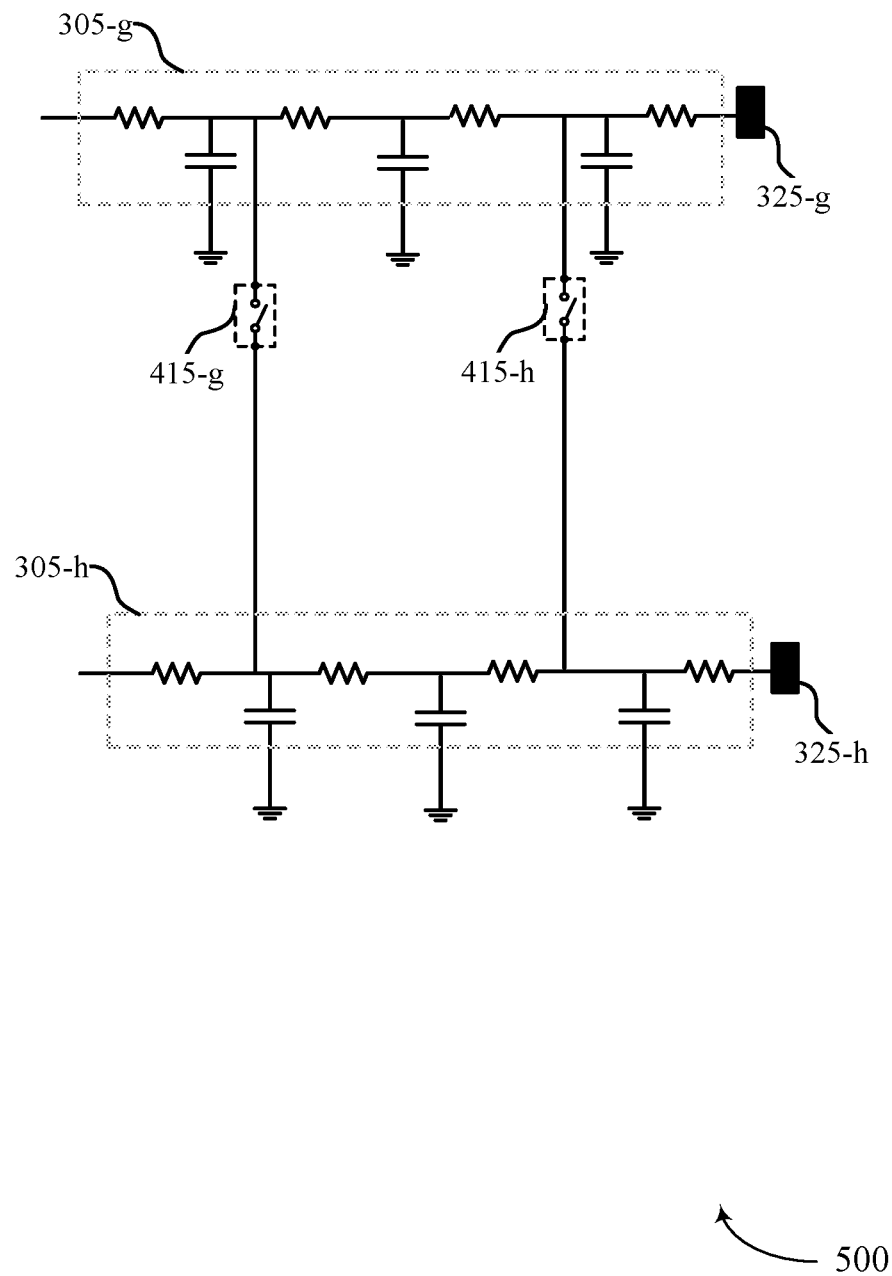
FIG. 5 illustrates an example of a circuit that supports dynamic allocation of a capacitive component in a memory device in accordance with examples as disclosed herein.

FIG. 5 illustrates an example of a circuit 500 that supports dynamic allocation of a capacitive component in a memory device in accordance with examples as disclosed herein. Circuit 500 may include voltage rails 305, pads 325, and voltage sources as described with reference to FIGS. 3 and 4. Such voltage rails 305 may be used to transfer power or voltage from voltage sources to an array of memory cells (such as array of memory cells 330) and/or to other components on a memory die.

A control component (such as local memory controller 165, device memory controller 155, external memory controller 105, and/or other control circuitry that may be included on a memory die with the array of memory cells 330) may identify an operating condition associated with a voltage rail 305, such as a measured or predicted spike or droop in the voltage on the voltage rail 305 or at another location that is coupled with (e.g., receives a voltage from) voltage rail 305. Based on the identified operating condition, the control component may cause voltage rail 305-g to be coupled with voltage rail 305-h by activating one or more switching components 415. Such coupling of voltage rail 305-g with voltage rail 305-h may provide voltage rail 305-g and/or voltage rail 305-h with additional capacitance to maintain a voltage on voltage rail 305-g and/or voltage rail 305-h during at least a portion of a memory access operation, and may be performed in addition to or instead of coupling a capacitive component with voltage rail 305-g and/or voltage rail 305-h as described with reference to FIG. 4.

Figure 6:
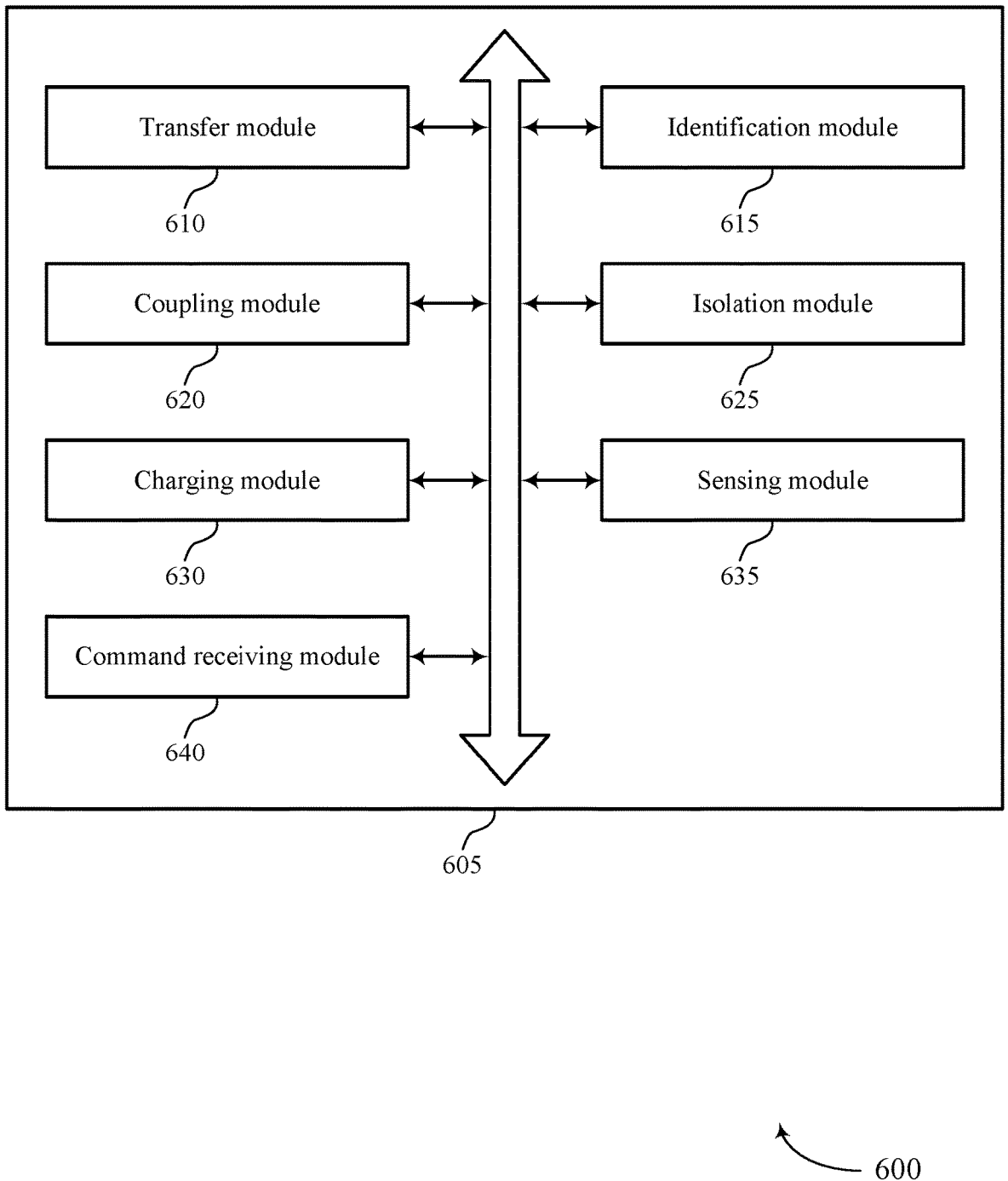
FIG. 6 shows a block diagram of a memory device that supports dynamic allocation of a capacitive component in a memory device in accordance with examples as disclosed herein.

FIG. 6 shows a block diagram 600 of a memory device 605 that supports dynamic allocation of a capacitive component in a memory device in accordance with examples as disclosed herein. The memory device 605 may be an example of aspects of a memory device as described with reference to FIGS. 1 through 5. The memory device 605 may include a transfer module 610, an identification module 615, a coupling module 620, an isolation module 625, a charging module 630, a sensing module 635, and a command receiving module 640. Each of these modules may communicate, directly or indirectly, with one another (e.g., via one or more buses).

The transfer module 610 may transfer, by a voltage rail isolated from a capacitive component, a voltage to an array of memory cells. In some examples, the transfer module 610 may transfer, by the voltage rail coupled with the capacitive component, the voltage to the array of memory cells. In some cases, the capacitive component includes a set of capacitors.

The identification module 615 may identify an operating condition associated with the voltage rail. In some examples, the identification module 615 may identify a second operating condition associated with a second voltage rail for transferring a second voltage to the array of memory cells.

The identification module 615 may identify an operating condition associated with a first voltage rail that is for transferring, based at least in part on a first supply voltage applied to the first voltage rail, a first voltage to an array of memory cells.

The coupling module 620 may couple the capacitive component with the voltage rail based on identifying the operating condition, the capacitive component for maintaining the voltage on the voltage rail for at least a portion of an access operation of the array of memory cells. In some examples, the coupling module 620 may activate a first set of one or more switching components to couple the set of capacitors with the voltage rail. In some examples, the coupling module 620 may activate a second set of one or more switching components to couple at least a portion of the set of capacitors with the second voltage rail. In some examples, the coupling module 620 may couple the portion of the capacitive component with the second voltage rail based on the second operating condition.

The coupling module 620 may couple, based at least in part on identifying the operating condition, the first voltage rail with a second voltage rail for transferring a second voltage to the array of memory cells based at least in part on a second supply voltage applied to the second voltage rail.

The isolation module 625 may isolate a portion of the capacitive component from the voltage rail based on the second operating condition.

The charging module 630 may charge the portion of the capacitive component to a third voltage after isolating the portion of the capacitive component from the voltage rail and before coupling the portion of the capacitive component with the second voltage rail. In some examples, the charging module 630 may charge the capacitive component to a fourth voltage before coupling the capacitive component with the voltage rail. In some cases, the fourth voltage is based on a supply voltage applied to the voltage rail.

The sensing module 635 may sense one or more operating voltages at one or more locations on a die of the array of memory cells. In some cases, identifying the operating condition includes determining that at least one operating voltage of the one or more operating voltages satisfies a threshold.

The command receiving module 640 may receive one or more commands including a sequence of operations to be performed on the array of memory cells. In some cases, identifying the operating condition includes predicting, based on the one or more commands, that the voltage will satisfy a threshold when performing the sequence of operations.

Figure 7:
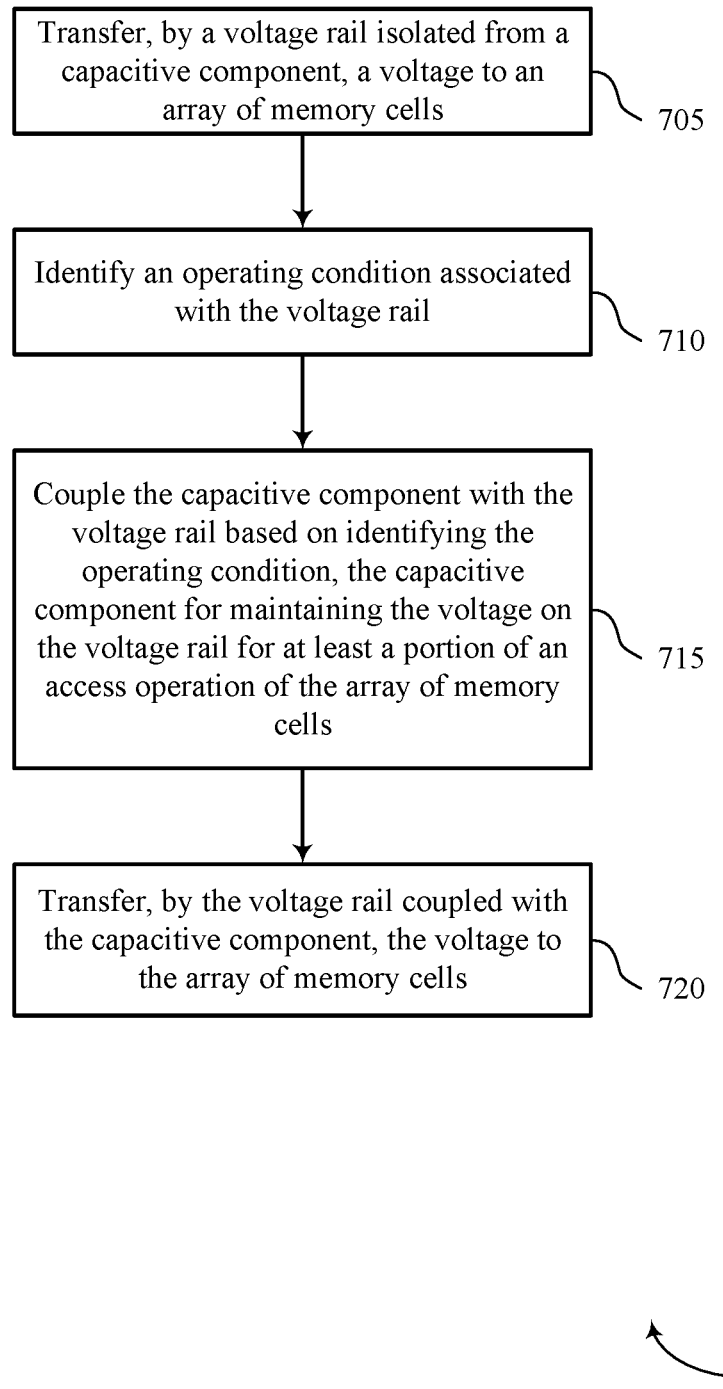
FIGS. 7 and 8 show flowcharts illustrating a method or methods that support dynamic allocation of a capacitive component in a memory device in accordance with examples as disclosed herein.

FIG. 7 shows a flowchart illustrating a method or methods 700 that supports dynamic allocation of a capacitive component in a memory device in accordance with examples as disclosed herein. The operations of method 700 may be implemented by a memory device or its components as described herein. For example, the operations of method 700 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 705, the memory device may transfer, by a voltage rail isolated from a capacitive component, a voltage to an array of memory cells. The operations of 705 may be performed according to the methods described herein. In some examples, aspects of the operations of 705 may be performed by a transfer component as described with reference to FIG. 6.

At 710, the memory device may identify an operating condition associated with the voltage rail. The operations of 710 may be performed according to the methods described herein. In some examples, aspects of the operations of 710 may be performed by an identification component as described with reference to FIG. 6.

At 715, the memory device may couple the capacitive component with the voltage rail based on identifying the operating condition, the capacitive component for maintaining the voltage on the voltage rail for at least a portion of an access operation of the array of memory cells. The operations of 715 may be performed according to the methods described herein. In some examples, aspects of the operations of 715 may be performed by a coupling component as described with reference to FIG. 6.

At 720, the memory device may transfer, by the voltage rail coupled with the capacitive component, the voltage to the array of memory cells. The operations of 720 may be performed according to the methods described herein. In some examples, aspects of the operations of 720 may be performed by a transfer component as described with reference to FIG. 6.

In some examples, an apparatus as described herein may perform a method or methods, such as the method 700. The apparatus may include features, means, or instructions (e.g., a non-transitory computer-readable medium storing instructions executable by a processor) for transferring, by a voltage rail isolated from a capacitive component, a voltage to an array of memory cells, identifying an operating condition associated with the voltage rail, coupling the capacitive component with the voltage rail based on identifying the operating condition, the capacitive component for maintaining the voltage on the voltage rail for at least a portion of an access operation of the array of memory cells, and transferring, by the voltage rail coupled with the capacitive component, the voltage to the array of memory cells.

Some examples of the method 700 and the apparatus described herein may further include operations, features, means, or instructions for identifying a second operating condition associated with a second voltage rail for transferring a second voltage to the array of memory cells, isolating a portion of the capacitive component from the voltage rail based on the second operating condition, and coupling the portion of the capacitive component with the second voltage rail based on the second operating condition.

Some examples of the method 700 and the apparatus described herein may further include operations, features, means, or instructions for charging the portion of the capacitive component to a third voltage after isolating the portion of the capacitive component from the voltage rail and before coupling the portion of the capacitive component with the second voltage rail.

In some examples of the method 700 and the apparatus described herein, the capacitive component includes a set of capacitors. In some examples of the method 700 and the apparatus described herein, coupling the capacitive component with the voltage rail may include operations, features, means, or instructions for activating a first set of one or more switching components to couple the set of capacitors with the voltage rail.

In some examples of the method 700 and the apparatus described herein, coupling the portion of the capacitive component with the second voltage rail may include operations, features, means, or instructions for activating a second set of one or more switching components to couple at least a portion of the set of capacitors with the second voltage rail.

Some examples of the method 700 and the apparatus described herein may further include operations, features, means, or instructions for sensing one or more operating voltages at one or more locations on a die of the array of memory cells, where identifying the operating condition includes determining that at least one operating voltage of the one or more operating voltages satisfies a threshold.

Some examples of the method 700 and the apparatus described herein may further include operations, features, means, or instructions for receiving one or more commands including a sequence of operations to be performed on the array of memory cells, where identifying the operating condition includes predicting, based at least in part on the one or more commands, that the voltage will satisfy a threshold when performing the sequence of operations.

Some examples of the method 700 and the apparatus described herein may further include operations, features, means, or instructions for charging the capacitive component to a fourth voltage before coupling the capacitive component with the voltage rail. In some examples of the method 700 and the apparatus described herein, the fourth voltage may be based on a supply voltage applied to the voltage rail.

Figure 8:
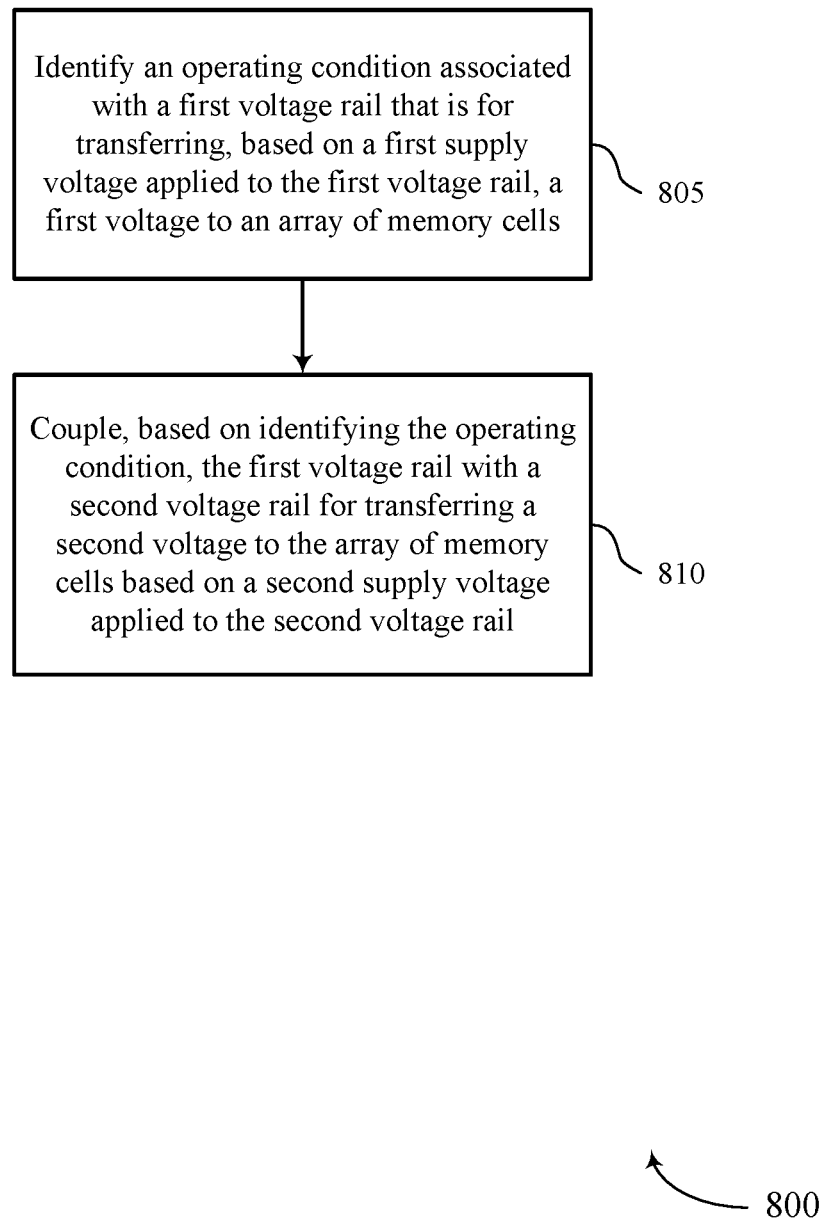

FIG. 8 shows a flowchart illustrating a method or methods 800 that supports dynamic allocation of a capacitive component in a memory device in accordance with examples as disclosed herein. The operations of method 800 may be implemented by a memory device or its components as described herein. For example, the operations of method 800 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 805, the memory device may identify an operating condition associated with a first voltage rail that is for transferring, based on a first supply voltage applied to the first voltage rail, a first voltage to an array of memory cells. The operations of 805 may be performed according to the methods described herein. In some examples, aspects of the operations of 805 may be performed by an identification module as described with reference to FIG. 6.

At 810, the memory device may couple, based on identifying the operating condition, the first voltage rail with a second voltage rail for transferring a second voltage to the array of memory cells based on a second supply voltage applied to the second voltage rail. The operations of 810 may be performed according to the methods described herein. In some examples, aspects of the operations of 810 may be performed by a coupling module as described with reference to FIG. 6.

In some examples, an apparatus as described herein may perform a method or methods, such as the method 800. The apparatus may include features, means, or instructions (e.g., a non-transitory computer-readable medium storing instructions executable by a processor) for identifying an operating condition associated with a first voltage rail that is for transferring, based on a first supply voltage applied to the first voltage rail, a first voltage to an array of memory cells and coupling, based on identifying the operating condition, the first voltage rail with a second voltage rail for transferring a second voltage to the array of memory cells based on a second supply voltage applied to the second voltage rail.

Some examples of the method 800 and the apparatus described herein may further include operations, features, means, or instructions for sensing one or more operating voltages at one or more locations on a die of the array of memory cells, where identifying the operating condition includes determining that at least one operating voltage of the one or more operating voltages satisfies a threshold.

Some examples of the method 800 and the apparatus described herein may further include operations, features, means, or instructions for receiving one or more commands including a sequence of operations to be performed on the array of memory cells, where identifying the operating condition includes predicting, based at least in part on the one or more commands, that the first voltage will satisfy a threshold when performing the sequence of operations.

In some examples of the method 800 and the apparatus described herein, coupling the second voltage rail with the first voltage rail may include operations, features, means, or instructions for activating a set of one or more switching components to couple the second voltage rail with the first voltage rail.

It should be noted that the methods described above describe possible implementations, and that the operations and the steps may be rearranged or otherwise modified and that other implementations are possible. Furthermore, aspects from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
    receiving one or more commands associated with a sequence of operations to be performed on an array of memory cells, the array of memory cells coupled with a voltage rail, the voltage rail coupled with one or more voltage sources;
    predicting that a voltage of the voltage rail will satisfy a threshold voltage based at least in part on the sequence of operations;
    coupling, during at least a portion of time that the voltage rail is coupled with the one or more voltage sources, one or more capacitors of a capacitive component with the voltage rail based at least in part on predicting that the voltage will satisfy the threshold voltage; and
    performing the sequence of operations in accordance with the one or more commands and based at least in part on the voltage rail coupled with the one or more capacitors.

2. The method of claim 1, further comprising:
    performing, prior to receiving the one or more commands, the sequence of operations on a second array of memory cells of a memory device; and
    identifying one or more voltages on a second voltage rail coupled with the second array of memory cells based at least in part on performing the sequence of operations on the second array of memory cells, wherein predicting that the voltage of the voltage rail will satisfy the threshold voltage is based at least in part on the one or more voltages on the second voltage rail.

3. The method of claim 1, further comprising:
    predicting that the voltage of the voltage rail will satisfy the threshold voltage based at least in part on the sequence of operations, wherein each sequence of a plurality of sequences of operations corresponds to a respective set of one or more voltages.

4. The method of claim 1, further comprising:
    predicting that the voltage of the voltage rail will satisfy the threshold voltage based at least in part on a type of one or more operations of the sequence of operations.

5. The method of claim 1, further comprising:
    transferring, by the voltage rail coupled with the one or more capacitors, one or more voltages to the array of memory cells, wherein performing the sequence of operations is based at least in part on transferring the one or more voltages.

6. The method of claim 5, wherein the one or more capacitors maintain the one or more voltages on the voltage rail for at least a portion of the sequence of operations.

7. The method of claim 1, further comprising:
    activating a set of one or more switching components to couple the one or more capacitors of the capacitive component with the voltage rail, wherein the one or more capacitors correspond to a subset of capacitors of a plurality of capacitors included in the capacitive component.

8. The method of claim 7, further comprising:
    activating a second set of one or more switching components to couple a second subset of capacitors of the plurality of capacitors of the capacitive component with a second voltage rail based at least in part on the sequence of operations.

9. The method of claim 7, wherein a quantity of the one or more capacitors is based at least in part on one or more voltages associated with the sequence of operations.

10. The method of claim 1, further comprising:
    charging the one or more capacitors to a first voltage prior to coupling the one or more capacitors with the voltage rail, wherein the first voltage is based at least in part on a supply voltage applied to the voltage rail.

11. The method of claim 1, wherein the sequence of operations comprises a read operation, a write operation, a refresh operation, or any combination thereof.

12. An apparatus, comprising:
    an array of memory cells;
    a voltage rail coupled with the array of memory cells;
    a plurality of capacitors each configurable to couple with a respective portion of the voltage rail;
    a plurality of switching components each configurable to couple a respective capacitor of the plurality of capacitors with the respective portion of the voltage rail based at least in part on a sequence of operations; and
    circuitry configured to:
        receive one or more commands associated with the sequence of operations;
        predict that a voltage of the voltage rail will satisfy a threshold voltage based at least in part on the sequence of operations; and
        activate the plurality of switching components to couple the plurality of capacitors with the voltage rail based at least in part on predicting that the voltage will satisfy the threshold voltage.

13. The apparatus of claim 12, wherein the circuitry is configured to:
    perform, prior to receiving the one or more commands, the sequence of operations on a second array of memory cells of the apparatus; and
    identify one or more voltages on a second voltage rail coupled with the second array of memory cells based at least in part on performing the sequence of operations on the second array of memory cells, wherein predicting that the voltage of the voltage rail will satisfy the threshold voltage is based at least in part on the one or more voltages on the second voltage rail.

14. The apparatus of claim 12, wherein the circuitry is configured to predict that the voltage of the voltage rail will satisfy the threshold voltage based at least in part on the sequence of operations, wherein each sequence of operations of a plurality of sequences of operations corresponds to a respective set of one or more voltages.

15. The apparatus of claim 12, wherein the circuitry is configured to predict that the voltage of the voltage rail will satisfy the threshold voltage based at least in part on a type of one or more operations of the sequence of operations.

16. An apparatus, comprising:
    an array of memory cells;
    a first voltage rail coupled with the array of memory cells and configured to transfer a first voltage to the array of memory cells based at least in part on a first supply voltage applied to the first voltage rail;

a second voltage rail coupled with the array of memory cells and configured to transfer a second voltage to the array of memory cells based at least in part on a second supply voltage applied to the second voltage rail;

a set of one or more switching components configured to couple the first voltage rail with the second voltage rail; and circuitry configured to:
- receive one or more commands associated with a sequence of operations for the array of memory cells;
- predict that the first voltage of the first voltage rail will satisfy a threshold voltage based at least in part on the sequence of operations; and
- activate the set of one or more switching components to couple the first voltage rail with the second voltage rail based at least in part on predicting that the first voltage will satisfy the threshold voltage.

17. The apparatus of claim 16, wherein the set of one or more switching components are configured to maintain the first voltage on the first voltage rail for at least a portion of the sequence of operations based at least in part on coupling the first voltage rail with the second voltage rail.

\* \* \* \* \*